(12) United States Patent
Palis et al.

(10) Patent No.: US 9,820,405 B1
(45) Date of Patent: *Nov. 14, 2017

(54) OPTIMIZED SERVER DESIGN USING DENSE DIMM SPACING, WIDE HEATSINK, IMPROVED ROUTING CHANNELS, AND IMPROVED AIR DELIVERY TO REAR DEVICES

(71) Applicant: EMC IP Holding Company LLC, Hopkinton, MA (US)

(72) Inventors: Michael R. Palis, Lancaster, MA (US); Robert P. Wierzbicki, Worcester, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/042,694

(22) Filed: Feb. 12, 2016

Related U.S. Application Data

(63) Continuation of application No. 14/036,330, filed on Sep. 25, 2013, now Pat. No. 9,261,925.

(51) Int. Cl.
*H05K 7/20* (2006.01)
*H05K 7/14* (2006.01)
*G06F 1/18* (2006.01)

(52) U.S. Cl.
CPC .......... *H05K 7/1487* (2013.01); *G06F 1/186* (2013.01); *H05K 7/20727* (2013.01)

(58) Field of Classification Search
CPC ... H05K 7/1487; H05K 7/20727; G06F 1/186
USPC ........... 361/679.02, 679.32, 679.46–679.54, 361/688–723; 29/832, 837; 174/250–268
See application file for complete search history.

(56) References Cited

U.S. PATENT DOCUMENTS

| | | | | |
|---|---|---|---|---|
| 4,749,357 | A * | 6/1988 | Foley | H01R 12/7088 439/65 |
| 5,513,135 | A * | 4/1996 | Dell | G11C 5/06 365/52 |
| 5,708,297 | A * | 1/1998 | Clayton | H01L 23/13 257/712 |
| 5,945,746 | A * | 8/1999 | Tracewell | H05K 7/20572 165/104.33 |
| 6,046,421 | A * | 4/2000 | Ho | G11C 29/56016 209/571 |
| 6,064,570 | A * | 5/2000 | Wang | H05K 7/20154 165/80.3 |
| 6,097,883 | A * | 8/2000 | Dell | G11C 5/04 361/679.32 |

(Continued)

*Primary Examiner* — Anthony Haughton
*Assistant Examiner* — Yahya Ahmad
(74) *Attorney, Agent, or Firm* — Krishnendu Gupta

(57) ABSTRACT

Example embodiments of the present invention provide a method of manufacture and an apparatus for optimized server design using dense DIMM spacing, wide heatsink, improved routing channels, and improved air delivery to rear devices. The method of manufacture comprise providing a plurality of compliant pin memory sockets on a first side of a circuit board at a pitch less than that specified in a reference layout requiring solder tail memory sockets and providing a plurality of surface mount capacitors on the second side of the circuit board enabling at least one pair of the plurality of compliant pin memory sockets to be provided at the pitch less than that specified in the reference layout.

18 Claims, 11 Drawing Sheets

(56) References Cited

U.S. PATENT DOCUMENTS

| | | | |
|---|---|---|---|
| 6,410,983 B1* | 6/2002 | Moriizumi | H01L 23/5385 257/701 |
| 6,449,166 B1* | 9/2002 | Sly | G11O 5/04 361/760 |
| 7,354,281 B1* | 4/2008 | Brodsky | H05K 1/181 439/717 |
| 7,722,359 B1* | 5/2010 | Frangioso, Jr. et al. | H05K 7/1445 361/679.48 |
| 2004/0113607 A1* | 6/2004 | Co | G01B 31/318505 324/756.07 |
| 2004/0223309 A1* | 11/2004 | Haemer | G01R 1/07314 361/767 |
| 2008/0157334 A1* | 7/2008 | Fan | G11C 5/04 257/690 |
| 2008/0179731 A1* | 7/2008 | Fan | H05K 1/0271 257/690 |
| 2008/0180899 A1* | 7/2008 | Pearson et al. | G11C 5/04 361/679.31 |
| 2008/0256281 A1* | 10/2008 | Fahr et al. | G06F 13/16 710/305 |
| 2009/0059520 A1* | 3/2009 | Tanaka et al. | H05K 7/20727 361/692 |
| 2011/0053391 A1* | 3/2011 | Vrenna et al. | H01R 12/721 439/78 |
| 2012/0112779 A1* | 5/2012 | Smith et al. | G01R 1/07342 324/755.01 |
| 2012/0202364 A1* | 8/2012 | Rathburn | H05K 3/32 439/91 |
| 2012/0244728 A1* | 9/2012 | Rathburn | H01C 1/14 439/83 |
| 2013/0183862 A1* | 7/2013 | Ni et al. | G06F 1/1632 439/620.22 |
| 2013/0194745 A1* | 8/2013 | Meijer et al. | G06F 1/20 361/679.47 |
| 2013/0316551 A1* | 11/2013 | Day, Jr. et al. | H05K 13/04 439/84 |
| 2014/0043782 A1* | 2/2014 | Rathburn | G01R 1/0416 361/760 |
| 2014/0099815 A1* | 4/2014 | Foster, Sr. | H01R 12/7029 439/327 |

* cited by examiner

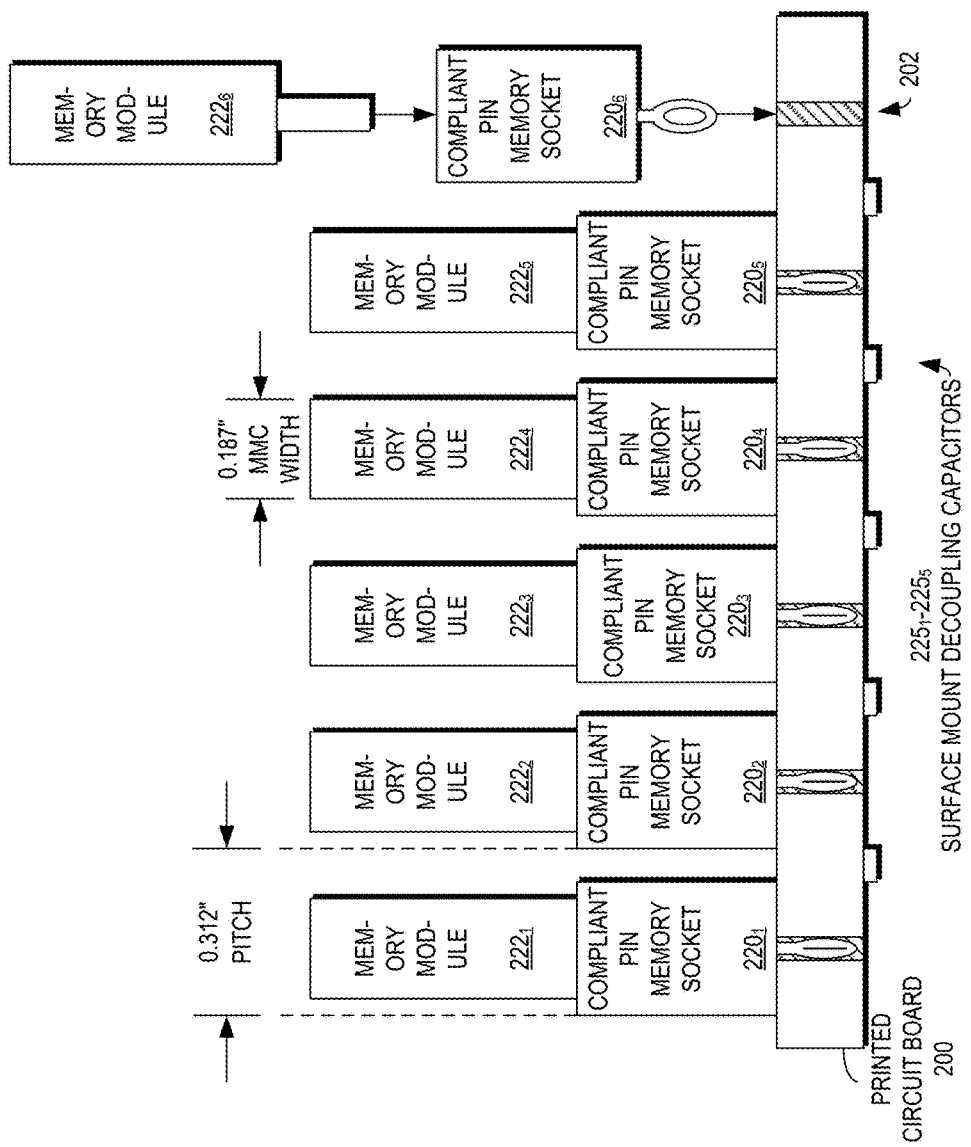
FIG. 2A (0.187" MMC)

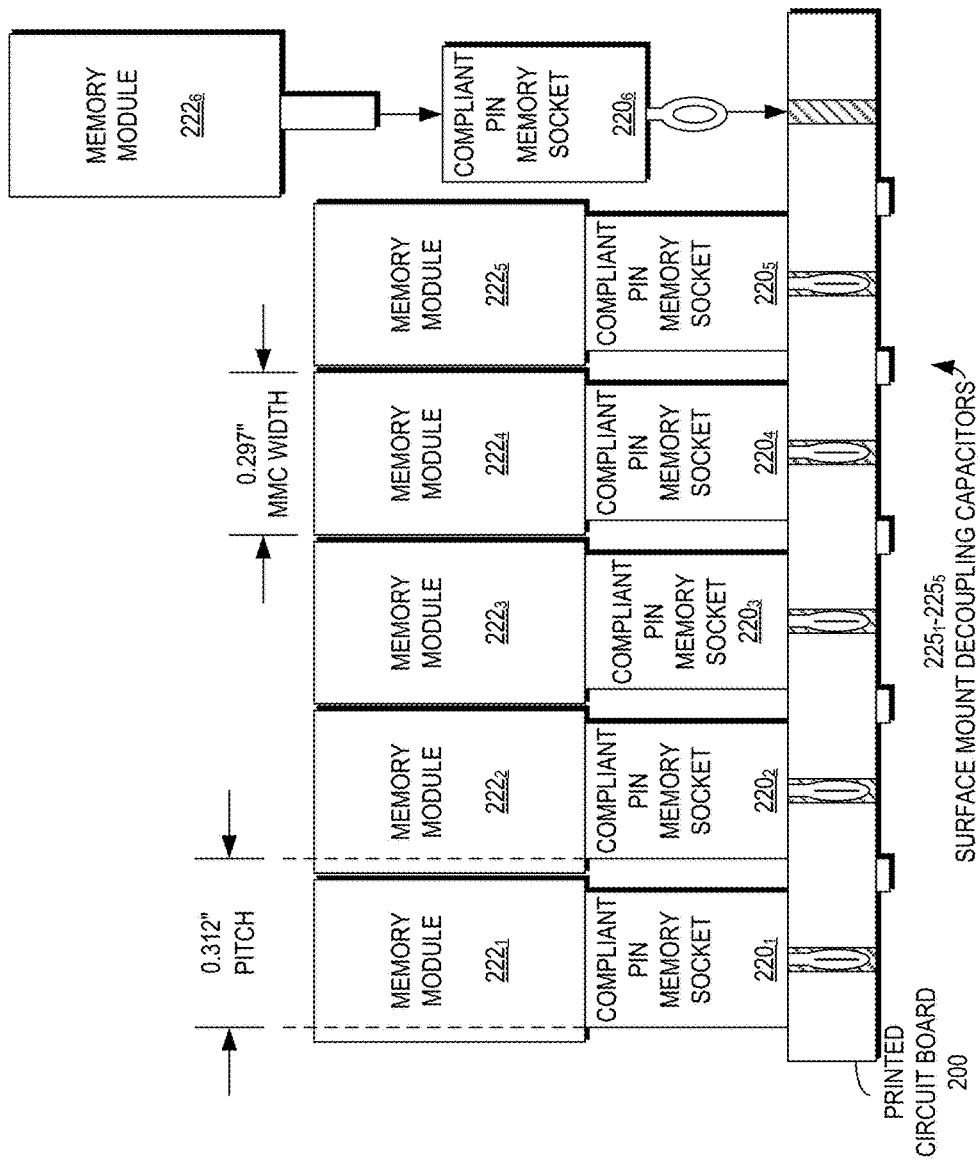
FIG. 2B (0.297" MMC)

MIDDLE CHANNEL WIDTHS PROVIDED BY 0.187" MMC DIMM

MIDDLE CHANNEL WIDTHS PROVIDED BY 0.297" MMC DIMM

FLOW RATE V. FLOW RESISTANCE FOR 6 PARALLEL 0.187" MMC DIMM

FLOW RATE V. FLOW RESISTANCE FOR 6 PARALLEL 0.297" MMC DIMM

FLOW RATE V. SYSTEM RESISTANCE (E.G., FIG. 3A) FOR 0.187" MMC DIMM

FLOW RATE V. SYSTEM RESISTANCE (E.G., FIG. 3B) FOR 0.297" MMC DIMM

DIMM PITCH V. FLOW RATE PER SECTION FOR 0.187" MMC DIMM

DIMM PITCH V. FLOW RATE PER SECTION FOR 0.297" MMC DIMM

OPTIMIZED SERVER DESIGN USING DENSE DIMM SPACING, WIDE HEATSINK, IMPROVED ROUTING CHANNELS, AND IMPROVED AIR DELIVERY TO REAR DEVICES

RELATED APPLICATION

This is a Continuation of U.S. Pat. No. 9,261,925 issued on Feb. 16, 2016 entitled "OPTIMIZED SERVER DESIGN USING DENSE DIMM SPACING, WIDE HEATSINK, AND IMPROVED AIR DELIVERY TO REAR HOST BUS ADAPTERS" the content and teachings of which are hereby incorporated by reference in their entirety.

A portion of the disclosure of this patent document may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This application relates to printed circuit board layout.

BACKGROUND

Sever layouts, in particular those that are targeting twenty four Dual Inline Memory Module (DIMM) modules and twin Central Processing Units (CPUs) all fitting in, for example, a nineteen inch rack, use a wide DIMM pitch (i.e., spacing between DIMM modules) and a nonsymmetrical CPU heatsink. These rational reference layouts have several disadvantages. This traditional reference layout lowers the amount of cooling air to the CPU heatsinks due to their increase length, which is necessary to recover the performance of the narrow heatsink so that the heat transfer area can be increased to transfer the heat being dissipated by the CPU. This increase in the length of the heatsink increases the flow resistance of the heatsink and, when coupled with the wider DIMM pitch, which has a lower resistance to flow, more cooling air will be going through the lower power DIMM modules and less cooling air will be available to the higher power CPU.

SUMMARY

Example embodiments of the present invention provide a method of manufacture and an apparatus for optimized server design using dense DIMM spacing, wide heatsink, improved routing channels, and improved air delivery to rear devices. The method of manufacture comprise providing a plurality of compliant pin memory sockets on a first side of a circuit board at a pitch less than that specified in a reference layout requiring solder tail memory sockets and providing a plurality of surface mount capacitors on the second side of the circuit board enabling at least one pair of the plurality of compliant pin memory sockets to be provided at the pitch less than that specified in the reference layout.

BRIEF DESCRIPTION OF THE DRAWINGS

The above and further advantages of the present invention may be better under stood by referring to the following description taken into conjunction with the accompanying drawings in which:

FIGS. 2A and 2B are cross-sectional block diagrams illustrating groups of memory sockets and surface mount decoupling capacitors provided on a printed circuit board according to respective example embodiments of the present invention;

DETAILED DESCRIPTION

Figure 1:
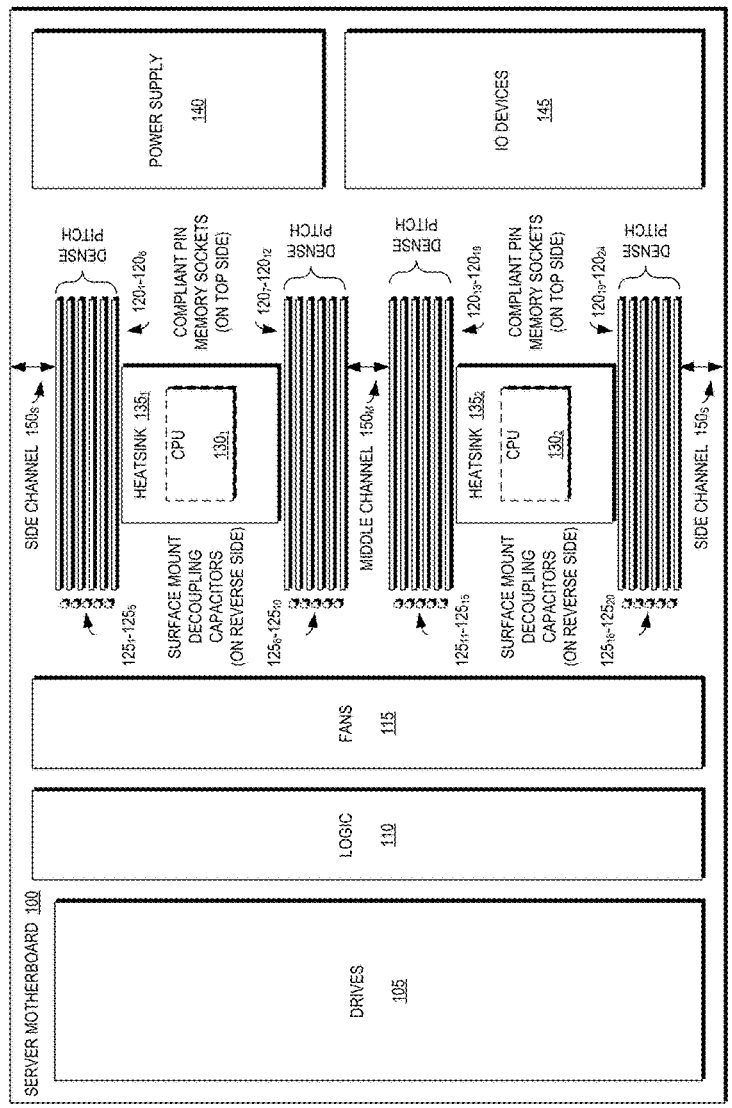
FIG. 1 is a block diagram illustrating a printed circuit board according to an example embodiment of the present invention.

Many traditional sever reference layouts target twenty four memory modules and dual CPUs all fitting in a nineteen inch rack using a wide memory module pitch and a asymmetrical CPU heatsink. These rational reference layouts have several disadvantages.

First, they lower the amount of cooling air to the CPU heatsinks due to their increase length versus width exposed to cooling air. This increased length is necessary to recover the cooling performance of the narrow heatsink so that the heat transfer area can be gained to transfer the heat being dissipated by the CPU. This increase in the length of the heatsink increases the flow resistance of the heatsink and when coupled with the wider memory module spacing, which has a lower resistance to flow, causes more cooling air to go through the lower-power memory modules and less cooling air to be available to the higher-power CPU.

Further, due to the wider memory module pitch, there is no center air channel for cooling air to be channeled directly to rear mounted devices (e.g., IO host bus adapters (HBAs) and power supplies) that require cooling air to maintain their thermal management requirements. Additionally, this channel is not available for use as a routing channel to route high speed signal paths from devices in the front of the server (e.g., drives, control panels, and services IO ports/modules) to the devices that are in the rear of the server (e.g., IO Hub Controller (IOH), Platform Controller Hub (PCH), and HBAs).

Moreover, wider memory module pitches require longer signal routing lengths that will introduce signal integrity issues as the speed of these signals traveling over these increased lengths, or crosstalk with the memory signals because of lack of routed space However, example embodiments of the present invention overcome these and other disadvantages of traditional server layouts by providing a dense memory module pitch. In certain embodiments, the following design features may be incorporated into server layout according to example embodiments of the present invention:

(1) reduced spacing (pitch) between the memory sockets as compared to the pitch in previous reference designs;

(2) use of a wider, denser, and symmetrical heatsink without excessive pressure drop characteristics;

(3) spacing provisions provided by the dense memory socket pitch allows for having an open channel above the printed circuit board (PCB) for pressurized cooler air to be routed to the IO devices that reside in the rear of most server applications and having dedicated high density routing channels in the PCB for routing high speed signal from the rear of the server to connecting devices in the front of the server; and (4) incorporates having twenty four memory sockets, two CPUs with respective symmetrical heatsinks, and air cooling channels for rear mounted IO devices all to reside in a standard nineteen inch standard rack mounted server enclosure (especially a 1U server enclosure).

Advantages of example embodiments of the present invention over traditional server layouts provided by the dense memory socket pitch and wider (e.g., 96 mm) heatsink include:

(1) the presence of a center air channel above the PCB and a circuit routing corridor from the front of the server to the rear of the server, thereby allowing for a cooling air channel to provide colder air to the rear mounted IO devices to reduce their inlet temperatures and a routing lane for high speed signaling that interconnect the front of the server to the rear mounted devices;

(2) a higher pressure drop across the elements on the PCB to accommodate a dense heatsink configuration to provide lower temperatures on the CPU for improved cooling;

(3) a higher pressure drop across the elements on the server motherboard to accommodate a dense heatsink configuration to provide lower temperatures on the CPU when operating in higher ambient environmental temperatures (e.g., American Society of Heating, Refrigerating and Air-Conditioning Engineers (ASHRAE) Environmental Class A4, which requires server operation in as 45° C. ambient environment).

FIG. 1 is a block diagram illustrating a printed circuit board (e.g., server motherboard) 100 according to an example embodiment of the present invention. As illustrated in FIG. 1, the server motherboard 100 may have space for storage devices, such as drives 105 and their associated logic/controllers 110 at the front of the server. The server motherboard 100 also may accommodate a plurality of memory sockets $120_1$-$120_{24}$ (120 generally), a plurality of decoupling capacitors $125_1$-$125_{20}$ (125 generally), one or more CPUs $130_1$, $130_2$ (130 generally), and their respective heatsinks $135_1$, $135_2$ (135 generally). The server motherboard 100 also may reserve space at the rear of the server for a power supply 140 and IO devices 145.

CPUs are increasing their power and thus are getting hotter than ever and now generally go to 135-145 Watts (W) thermal design power (TDP). Further, memory modules, such as double data rate 4 (DDR4) dual inline memory modules (DIMMs) in comparison with DDR3 DIMMs, are getting lower in power while memory connectors and equivalent modules are getting thinner length wise. Further, most servers have numerous IO devices 145 (i.e., cards) in the back (to accommodate cabling) with drives 105 in the front (to accommodate access). Industry standards dictate the environmental variables that must be considered. For example, most higher performance IO cards 145 operate at 25 W and are designed for a 55° C. ambient temperature. However, the inflow air at the front of the server may be as high as 45° C. for ASHRAE A4. That air is first heated by the drives 105 and then the server logic 110. That preheated air is then further heated by the CPUs 130/heatsinks 135. The effect of the increased power of the CPUs is exacerbated by other industry standards to save power and reduce fan speed. Therefore, it is easy for the inflow air to reach 55° C. before it reaches the IO cards 145.

As illustrated in FIG. 1, the memory sockets 120 may be compliant pin memory sockets disposed on a first side of the server motherboard 100 and the decoupling capacitors 125 may be surface mount capacitors 125 disposed on a second side of the server motherboard 100. Moreover, the compliant pin memory sockets 120 may be provided on the server motherboard 100 in groups (i.e., compliant pin memory sockets are provided in FIG. 1 in four groups of six sockets $120_1$-$120_6$, $120_7$-$120_{12}$, $120_{13}$-$120_{18}$, $120_{19}$, $120_{24}$). Such grouping may provide side channels $150_S$ and a middle channel $150_M$, which may be used to direct cooling air directly toward the IO devices 145 and to route cabling from the IO devices 145 to components at the front of the server, such as drives 105 and controllers 110.

It should be understood that traditional server layouts use solder tail memory sockets which not only have a large pin but also require a large through hole and solder pad for the solder wave process. It also should be understood that traditional server layouts provide same side surface mount decoupling capacitors between the solder tail memory sockets, thereby setting a high minimum memory socket pitch. Accordingly, the combination of the use of compliant pin memory sockets (which do not require a solder process) and the use of surface mount decoupling capacitors 125 on the reverse side of the server motherboard 100 from the compliant pin memory sockets 120 in example embodiments of the present invention allows for a denser grouping (i.e., lower pitch) of the compliant pin memory sockets 120 than traditional server layouts because the smaller pin, smaller through hole, lack of a solder pad, and elimination of the pitch floor imposed by the decoupling capacitor reduce the necessary lateral requirements.

Further, the smaller through hole required for compliant pin memory sockets 120 provides additional available surface area on the server motherboard 100 to increase space between the etch signal paths between the holes. When the through hole is larger and the surface area necessary for solder pads expands, as in the case of solder tail memory sockets, there is less available space to fit the etch such that it may not be able to be routed or it may induce crosstalk.

Moreover, it should be understood that surface mount decoupling capacitors cannot reasonably be soldered to the reverse side of traditional server motherboard because the infrared (IR) reflow solder process used to solder surface mount components requires a flat surface to place the solder paste screen. If solder tail memory sockets are soldered first to a top side of a traditional server motherboard, the memory socket pins extending beyond the through hole for solder fillet purposes disrupts the flat surface required for placing the solder paste screen. Further, if the solder paste screen is placed first on the reverse side of the server motherboard, or if the entire reflow solder process is first performed to solder surface mount capacitors on the reverse side of the motherboard server, the subsequent solder wave process for soldering the solder tail components would cause the solder paste/reflowed solder to melt and the surface mount capacitors to fall off. Thus, the surface mount capacitors in traditional server motherboards must be soldered to the top side of the motherboard between the memory sockets, forcing the pitch to have a floor of 0.370".

FIGS. 2A and 2B are cross-sectional block diagrams illustrating groups of memory sockets $220_1$-$220_6$ (220 generally) and surface mount decoupling capacitors $225_1$-$225_5$ (225 generally) provided on a printed circuit board 200 according to respective example embodiments of the present invention. Example embodiments of the present invention may accommodate memory modules $222_1$-$222_6$ complying with both the 0.187" and 0.297" geometric dimensioning and tolerancing (GDT) Maximum Material Condition (MMC) standards.

As illustrated in FIGS. 2A and 2B, in a preferred embodiment, the compliant pin memory sockets 220 may be disposed on the printed circuit board 200 at a pitch of 0.312". However, as will be described in greater detail below, other pitches may be chosen, such as 0.317", 0.322", 0.327", 0.332", and 0.337" or any other pitch in the range of 0.312"-0.370". However, there may be thermal and dimensional considerations that temper memory socket spacing. For example, as illustrated in FIG. 3B, in order to maintain a middle channel $150_M$ adequate to route a 0.300" diameter cable, in an implementation using 0.297" MMC memory modules the pitch has a floor of 0.327". Further, there may be material conditions of width of the memory modules themselves not just the sockets. Accordingly, as DIMMs get narrower, the pitch could be reduced further (however, Joint Electron Device Engineering Council (JEDEC) standards should be considered).

Accordingly, through holes 202 necessary for installation of the compliant pin memory sockets 220 may be provided on the printed circuit board 200. Then the surface mount decoupling capacitors 225 may be soldered to the reverse side of the printed circuit board, such as by a solder reflow process, followed by installation of the compliant pin memory sockets 220 on the top side of the printed circuit board 200, such as by being press fit using a tool. It should be understood that each respectively decoupling capacitor 225 may be comprised of a plurality of capacitors to provide the necessary capacitance. The memory modules $222_1$-$222_6$ (222 generally), themselves, then may be installed in the compliant pin memory sockets 220.

Figure 3A:
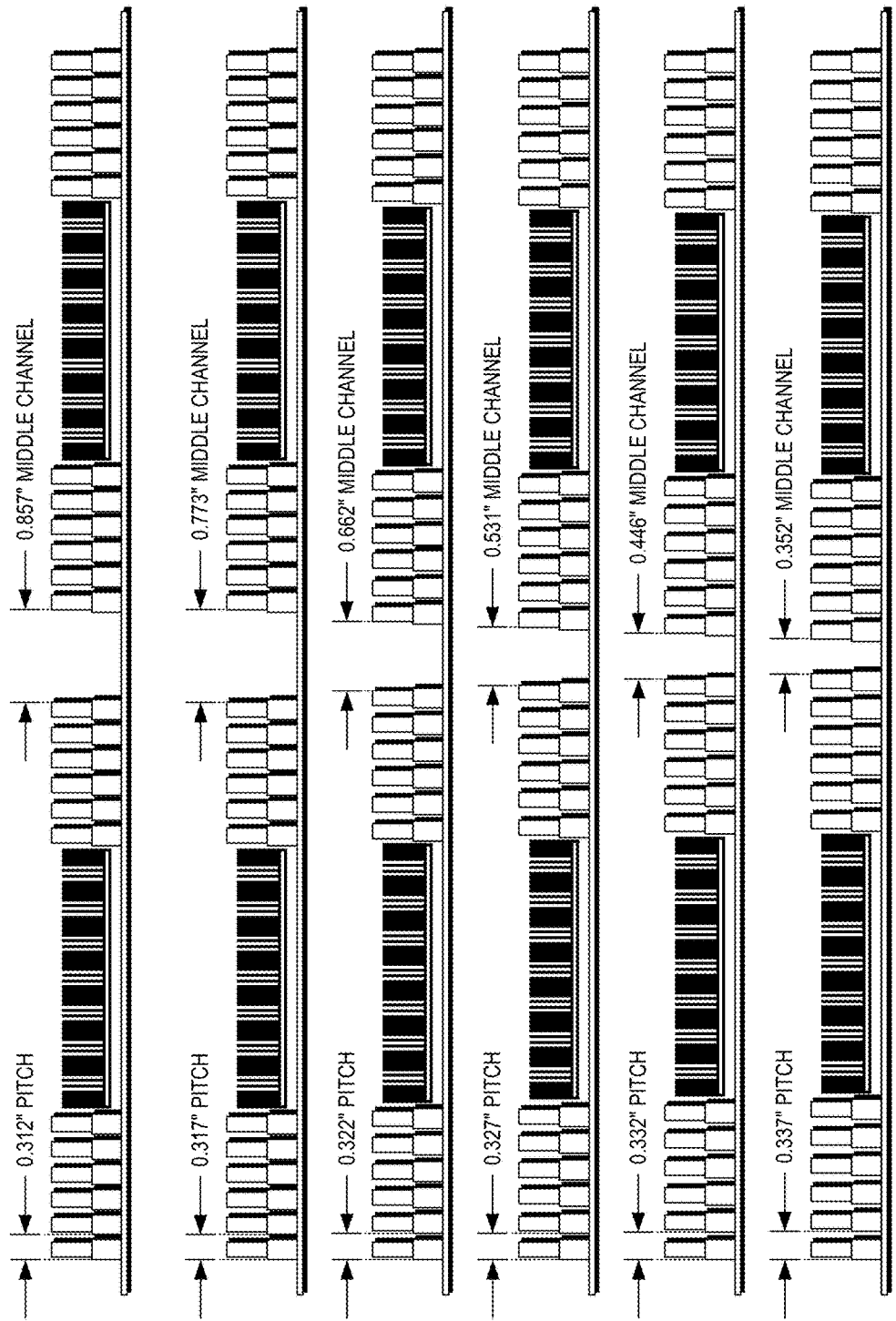
FIGS. 3A and 3B are cross-sectional block diagrams illustrating motherboards according to respective example embodiments of the present invention.
Figure 3B:
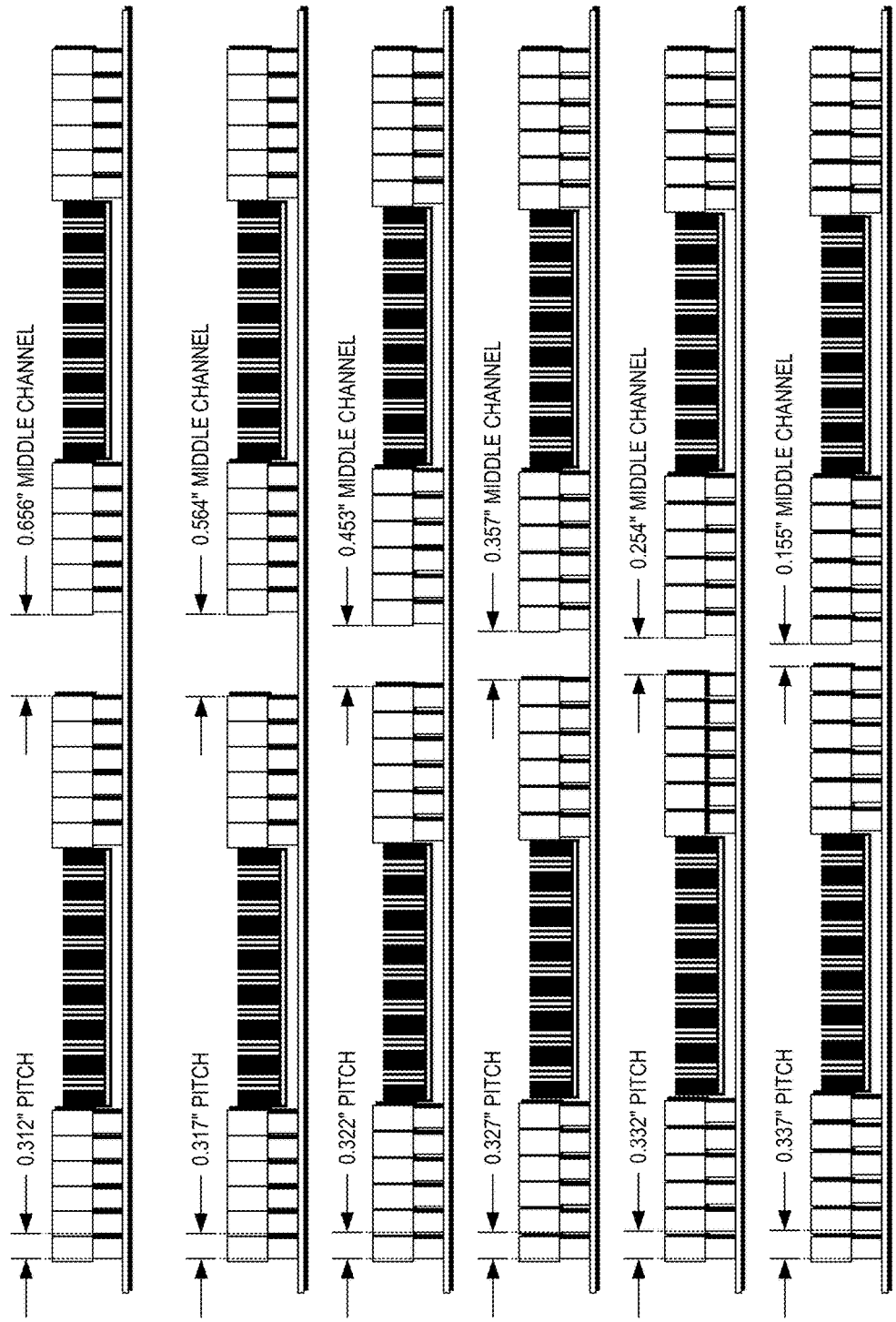

FIGS. 3A and 3B are cross-sectional block diagrams illustrating motherboards according to respective example embodiments of the present invention. As illustrated in FIGS. 3A and 3B, varying memory socket pitches, such as 0.312", 0.317", 0.322", 0.327", 0.332", and 0.337", may be provided for both 0.187" MMC and 0.297" MMC memory modules. Naturally, it should be understood that a denser pitch (e.g., 0.312") provides a wider middle channel (e.g., 0.656"/0.857") than the middle channel width (e.g., 0.155"/0.352") provided by a wider pitch (e.g., 0.337").

Figure 4A:
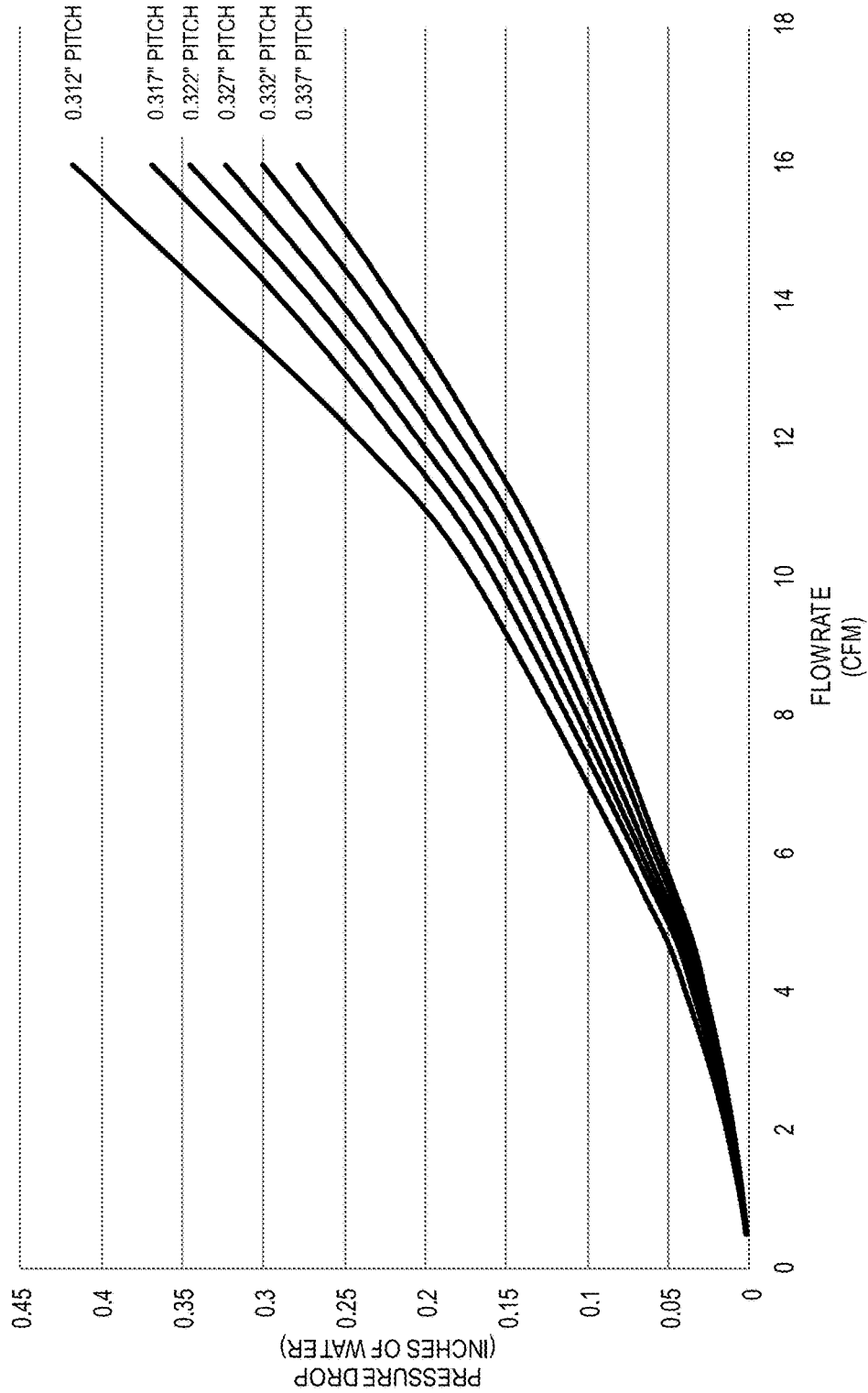
FIGS. 4A and 4B are plots of air flow rate versus air flow resistance for respective memory socket pitches according to respective example embodiments of the present invention.
Figure 4B:
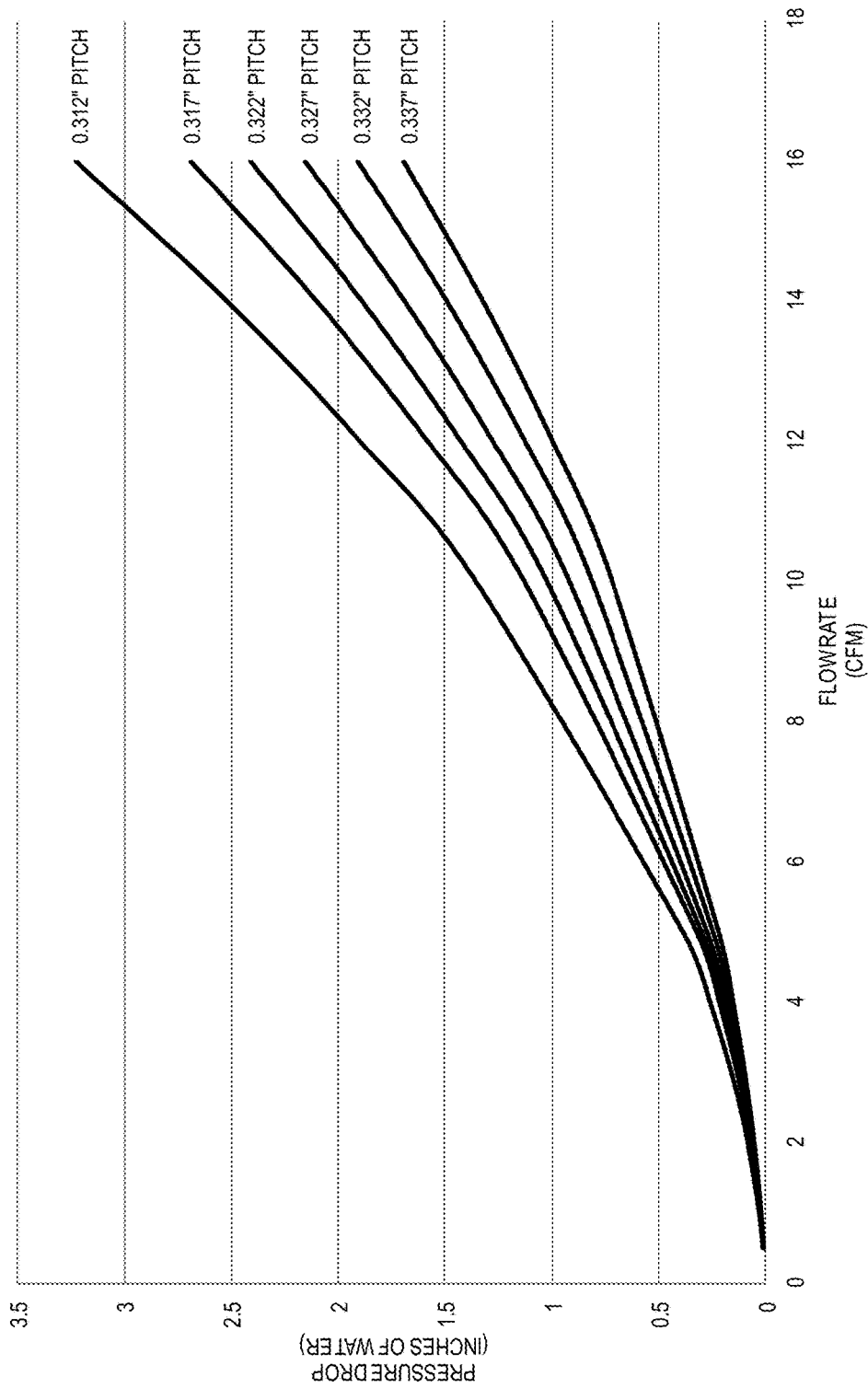

FIGS. 4A and 4B are plots of air flow rate versus air flow resistance for a group of six parallel memory modules according to respective example embodiments of the present invention. As illustrated in FIGS. 4A and 4B, pressure drop (i.e., air flow resistance) increases as pitch decreases and narrow 0.189" MMC memory module widths have a lower pressure drop than wide 0.297" MMC memory modules.

Figure 5A:
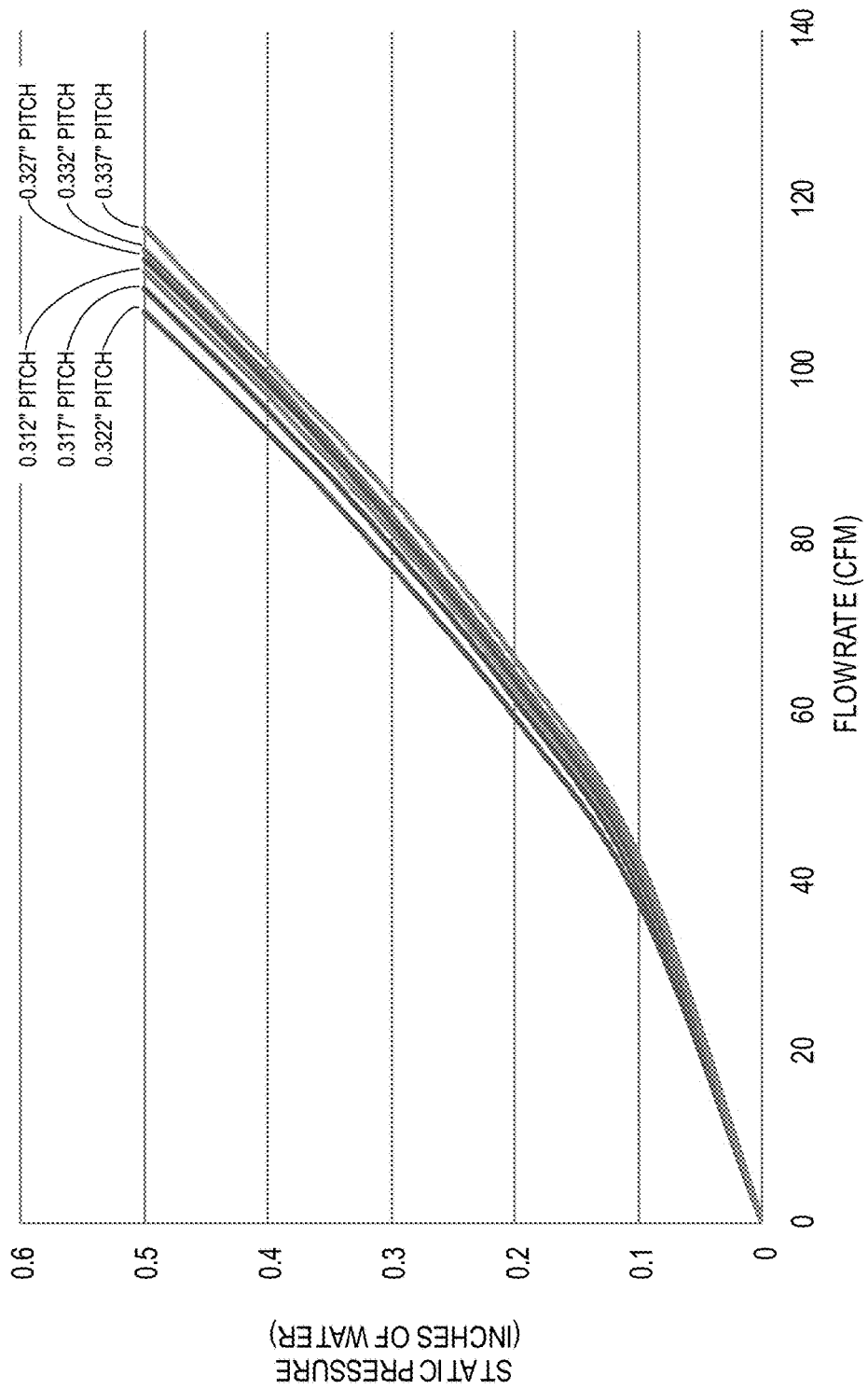
FIGS. 5A and 5B are plots of flow rate versus system resistance at respective memory socket pitches according to example embodiments of the present invention.
Figure 5B:
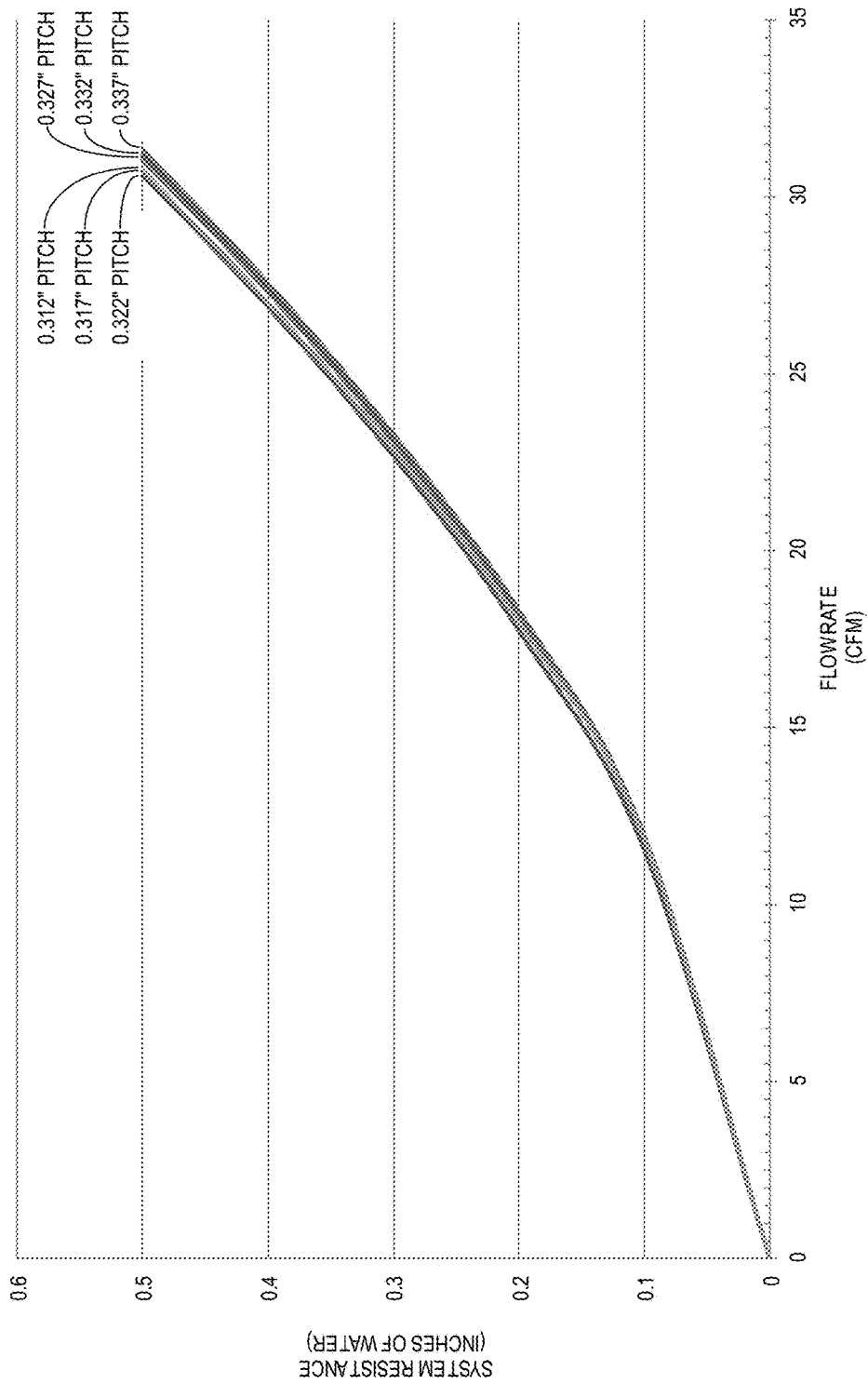

FIGS. 5A and 5B are plots of system flow rate versus system resistance for a system (e.g., FIG. 3A) using 0.187" and 0.297" MMC memory modules, respectively. As illustrated in FIGS. 5A and 5B, system flow resistance varies very little with pitch changes. For example, flow rate variation is very low when the memory module pitch is changed starting at 0.312" and ending at 0.337", respectively.

Figure 6A:
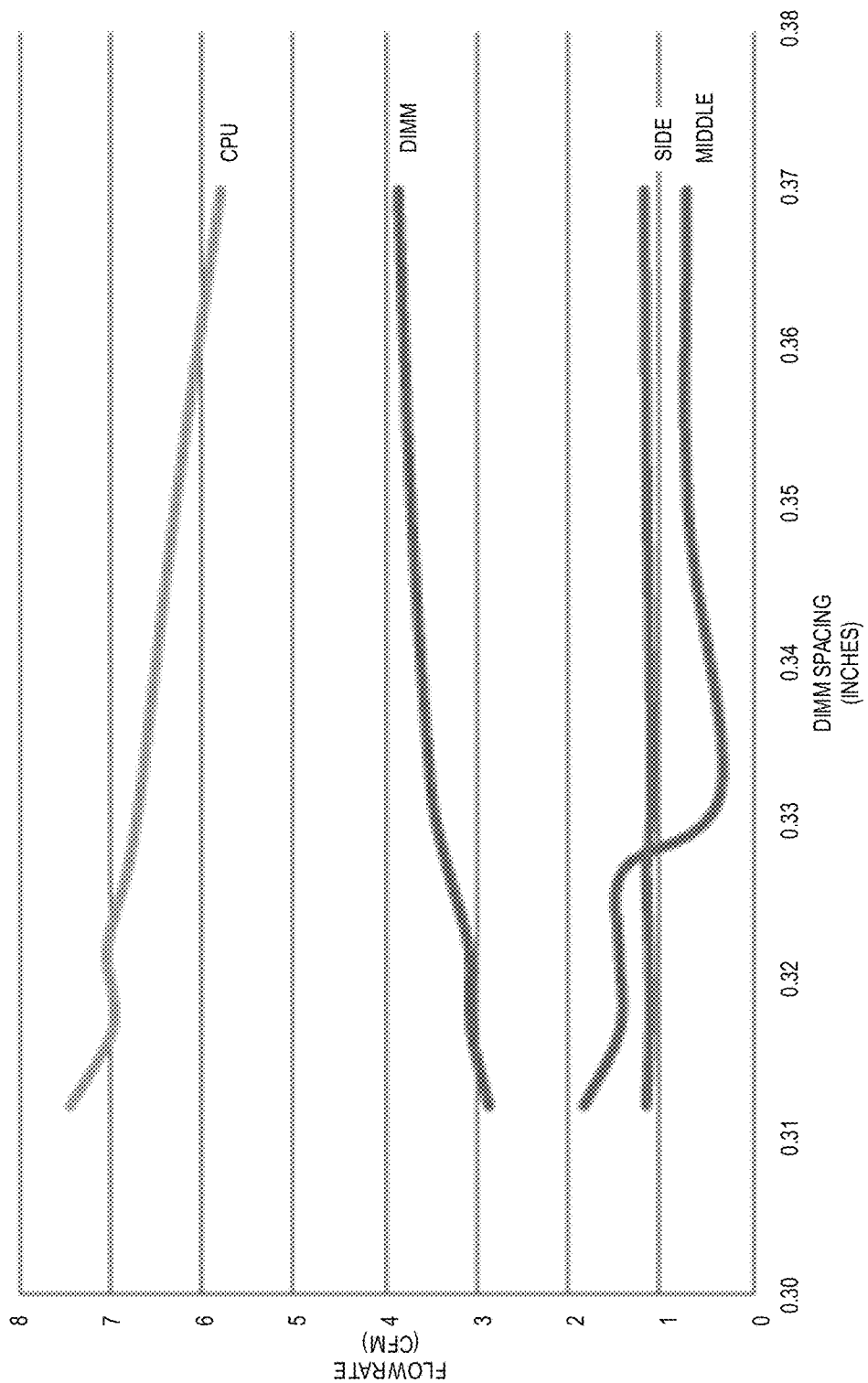
FIGS. 6A and 6B are plots of memory socket pitch versus air flow rate for respective air flow channels according to respective example embodiments of the present invention.
Figure 6B:
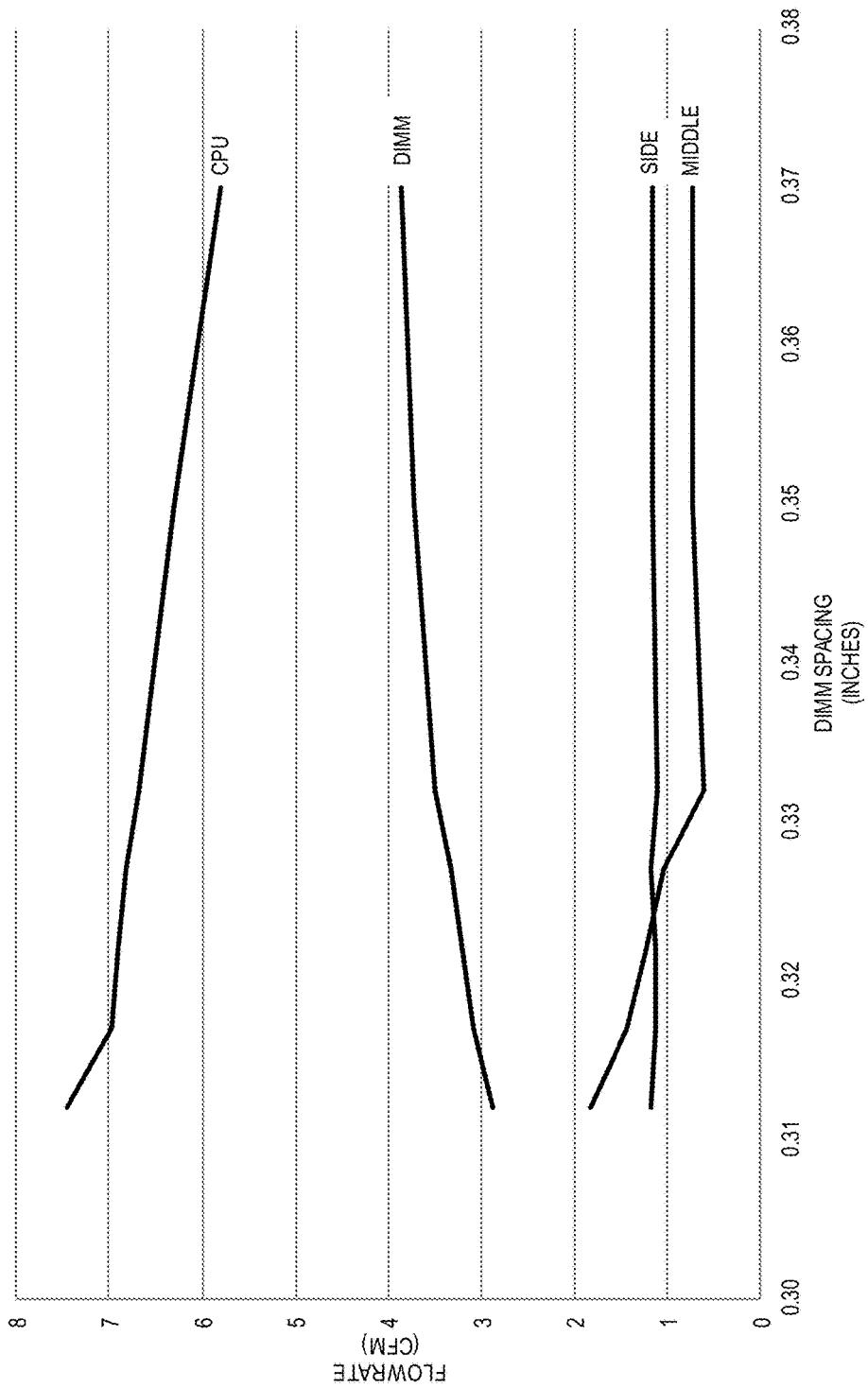

FIGS. 6A and 6B are plots of memory socket pitch versus air flow rate for respective air flow channels according to respective example embodiments of the present invention. It should be understood that the pitch may be adjusted to balance CPU and memory module flow rates as needed to provide adequate cooling to one or more of the CPU, the memory modules, and the rear components (e.g., HBAs).

Although the foregoing invention has been described in some detail for purposes of clarity of understanding, it will be apparent that certain changes and modifications may be practiced within the scope of the appended claims. Accordingly, the present implementations are to be considered as illustrative and not restrictive, and the invention is not to be limited to the details given herein, but may be modified within the scope and equivalents of the appended claims.

What is claimed is:

1. A method of manufacture comprising:
   providing a plurality of compliant pin memory sockets on a first side of a circuit board; and
   providing a plurality of surface mount decoupling capacitors on the second side of the circuit board.

2. The method of claim 1 wherein a pitch between at least one pair of the compliant pin memory sockets is selected from the range 0.312-0.337 inches.

3. The method of claim 2 wherein the provision of compliant pin memory sockets enables the at least one pair of the plurality of compliant pin memory sockets to be provided at the pitch less than that specified in the reference layout.

4. The method of claim 2 further comprising grouping the plurality of compliant pin memory sockets at the pitch less than that specified in the reference layout.

5. The method of claim 4 wherein grouping the plurality of compliant pin memory sockets comprises providing a channel associated with the circuit board between respective groups of compliant pin memory sockets.

6. The method of claim 5 wherein the channel is configured for routing a cable.

7. The method of claim 5 wherein the circuit board is configured for providing a fan configured to direct cooling air through the channel to additional downstream components.

8. The method of claim 1 wherein the circuit board is configured for providing a square-based heatsink on at least one processor provided on the circuit board.

9. The method of claim 8 wherein the circuit board is configured for providing a fan configured to direct cooling air over the heatsink and memory modules installed in the compliant pin memory sockets.

10. An apparatus comprising:
    a circuit board having a first side and a second side;
    a plurality of compliant pin memory sockets provided on the first side of the circuit board; and
    a plurality of surface mount decoupling capacitors provided on the second side of the circuit board.

11. The apparatus of claim 10 wherein a pitch between at least one pair of the compliant pin memory sockets is selected from the range 0.312-0.337 inches.

12. The apparatus of claim 11 wherein the provision of compliant pin memory sockets enables the at least one pair of the plurality of compliant pin memory sockets to be provided at the pitch less than that specified in the reference layout.

13. The apparatus of claim 11 wherein the plurality of compliant pin memory sockets are grouped at the pitch less than that specified in the reference layout.

14. The apparatus of claim 13 further comprising a channel associated with the circuit board between respective groups of compliant pin memory sockets.

15. The apparatus of claim 14 wherein the channel is configured for routing a cable.

16. The apparatus of claim 14 wherein the circuit board is configured for providing a fan configured to direct cooling air through the channel to additional downstream components.

17. The apparatus of claim 10 wherein the circuit board is configured for providing a square-based heatsink on at least one processor provided on the circuit board.

18. The apparatus of claim 17 wherein the circuit board is configured for providing a fan configured to direct cooling air over the heatsink and memory modules installed in the compliant pin memory sockets.

* * * * *